United States Patent [19]

Krongrad

[11] Patent Number: 5,250,284
[45] Date of Patent: Oct. 5, 1993

[54] METHOD FOR INCREASING NUCLEAR MAGNETIC RESONANCE SIGNALS IN LIVING BIOLOGICAL TISSUE USING ZINC

[76] Inventor: Arnon Krongrad, 9056 Emerson Ave., Surfside, Fla. 33154

[21] Appl. No.: 776,569

[22] Filed: Oct. 15, 1991

[51] Int. Cl.⁵ .................... G01N 24/08; A61K 33/32
[52] U.S. Cl. ........................ 424/9; 436/173; 128/653.4; 435/173.1; 424/643
[58] Field of Search ............. 424/9, 4, 643; 435/173; 436/173; 128/653.4, 654

[56] References Cited

U.S. PATENT DOCUMENTS

| | | | |
|---|---|---|---|
| 4,351,707 | 9/1982 | Turro | 204/158 |
| 4,532,217 | 7/1985 | Springer, Jr. et al. | 436/79 |
| 4,672,972 | 6/1987 | Berke | 128/653 |
| 4,731,239 | 3/1988 | Gordon | 424/9 |
| 4,735,796 | 4/1988 | Gordon | 424/9 |
| 4,779,619 | 10/1988 | Winkler | 128/653 |
| 4,849,210 | 7/1989 | Widder | 424/9 |
| 4,963,344 | 10/1990 | Gries et al. | 424/9 |
| 4,985,233 | 1/1991 | Klaveness et al. | 424/9 |

OTHER PUBLICATIONS

Martino, A. F. Physiol. Chem. Physics & Med. NMR 15:481-7 (1983).
Schnall, M.D. Radiology 172:570-4 (1989).
Unkefer, C. J. J. Clin. Pharmacol. 26:452-8 (1986).
Evelhoch, J. L. Investigational New Drugs 7:5-12 (1989).
Narayan, P. Magnetic Resonance in Medicine 11:209-20 (1989).
Neurohr, K. J. et al. Adv. Myocardiol. 6:185-93 (1985).
Garbow, et al., "Characterization of Covalent Protein Conjugates Using Solid-State $^{13}$C NMR Spectroscopy," Biochemistry, 30, 7, 057-7,062 (1991).
Shimizu, et al., "$^{43}$Ca and $^{67}$Zn NMR Study of Ca$^{2+}$, Zn$^{2+}$-Thermolysin Complexes," Biochemical and Biophysical Research Communication, vol. 104, No. 4, 1982.
Bhattacharyya, et al., "Nuclear Magnetic Resonance Investigation of Cadmium 113 Substituted Pea and Lentil Lectins," Journal of Biological Chemistry, vol. 262, No. 12, pp. 5616-5621 (1987).
Shimizu, T., Biochemical and Biophysical Research Communications, vol. 106, No. 3, (1982) 988-993.
Prout, Jr., et al., "Radioactive Zinc in the Prostate," J.A.M.A., vol. 169, No. 15, Apr. 11, 1959.
Johnston, et al., $^{65}$Zn and $^{69m}$Zn Studies in the Dog, Monkey, and Man, Journal of Surgical Research, vol. 8, No. 11, Nov. 1968.
Gittes, "Carcinoma of the Prostate," The New England Journal of Medicine, vol. 324, No. 4, Jan. 24, 1991.
Quint, et al., "Carcinoma of the Prostate: MR Images Obtained with Body Coils Do Not Accurately Reflect Tumor Volume," AJR:156, pp. 511-516, Mar. 1991.
R. Damadian, "Tumor Detection by Nuclear Magnetic Resonance," reported in Science (171:1151-53, 1971).
C. S. Springer, Jr., "Measurement of Metal Cation Compartmentalization in Tissue by High-Resolution Metal Cation NMR," Ann. Rev. Biophys. Chem. 16:375-99, 1987.
R. L. Nunnally and P. R. Antich, "New Directions in Medical Imaging of Cancer" (Cancer 67:1271-1277, 1991).
H. Kantor, et al., "In Vivo $^{31}$P Nuclear Magnetic Resonance Measurements in Canine Heart Using a Catheter Coil" (Circ Res 55:261-266, 1984).
I. R. Francis, et al., "Malignant Hepatic Tumors: P-31 MR Spectroscopy with One-Dimensional Chemical Shift Imaging" Radiology 180:341-344 (1991).

(List continued on next page.)

Primary Examiner—Glennon H. Hollrah
Assistant Examiner—Gary E. Hollinden
Attorney, Agent, or Firm—John W. Montgomery

[57] ABSTRACT

A method of enhancing a magnetic resonance signal comprising the steps of administering a quantity of a selected magnetic isotope to a living biological tissue at a concentration greater than the naturally occurring concentration of such isotope and detecting magnetic resonance signal from the administered magnetic isotope in the living biological tissue.

15 Claims, No Drawings

OTHER PUBLICATIONS

Terrier, et al., "Effect of Intravenous Fructose on the P-31 MR Spectrum of the Liver: Dose Response in Healthy Volunteers," *Radiology* 171:557–563, 1989.

Crooks et al., "Tomography of Hydrogen with Nuclear Magnetic Resonance (NMR) and the Potential for Imaging Other Body Constituents" *SPIE* 206:120–128, 1979.

Hashimoto, et al., "Study of Biodistribution of Enflurane in Rats with In Vivo $^{19}$F MRI," *Magnetic Resonance Imaging*, vol. 9, pp. 557–581, 1991.

Otting, et al., "Protein–DNA Contacts in the Structure of a Homeodomain–DNA Complex Determined by Nuclear Magnetic Resonance Spectroscopy in Solution," *The EMBO Journal*, vol. 9, No. 10, pp. 3085–3092, 1990.

Summers, "Zinc Finger Motif for Single-Stranded Nucleic Acids? Investigations by Nuclear Magnetic Resonance," *Journal of Cellular Biochemistry*, 45:41–48 (1991).

Schnall, et al., "Prostate Cancer: Local Staging with Endorectal Surface Coil MR Imaging," *Radiology* 1991; 178:797–802.

Poon, et al., "MRI of Periprostatic Venous Plexus in Staging of Early Prostatic Carcinoma," *Journal of the Canadian Association of Radiologists*, vol. 39, pp. 111–114 (1988).

van Zijl, et al., "Complete Separation of Intracellular and Extracellular Information in NMR Spectra of Perfused Cells by Diffusion-Weighted Spectroscopy," *Proc. Natl. Acad. Sci. USA*, vol. 88, pp. 3228–3232, Apr. 1991.

Narayan, et al., "Characterization of Prostate Cancer, Benign Prostatic Hyperplasia and Normal Prostates Using Transrectal Phosphorus Magnetic Resonance Spectroscopy: A Preliminary Report," *The Journal of Urology*, vol. 146, pp. 66–74, Jul. 1991.

Beam, et al., "Status of Clinical MR Evaluation 1985-1988: Baseline and Design for Further Assessments," *Radiology*, vol. 180, No. 1, pp. 264–269 (1991).

Taylor, et al., "Free Magnesium Levels in Normal Human Brain and Brain Tumors: $^{31}$P Chemical-Shift Imaging Measurements at 1.5 T," *Proc. Natl. Acad. Sci. U.S.A.*, vol. 88, pp. 6810–6814, Aug. 1991.

METHOD FOR INCREASING NUCLEAR MAGNETIC RESONANCE SIGNALS IN LIVING BIOLOGICAL TISSUE USING ZINC

This invention relates generally to nuclear magnetic resonance (NMR) signal detection in living biological tissue. It relates specifically a method of increasing detectable signals from the nucleus of magnetic atoms for the purpose of analysis of detected spectra and images generated by such signals and a method of applying the above in the study of normal and abnormal human and non-human biology, in both whole organisms (for example, human patients), living biological specimens from whole organisms (for example body fluids or biopsy specimens), or living biological living specimens separate from the organism of origin (for example cell or organ culture).

BACKGROUND OF THE INVENTION

Living biological metabolism has traditionally been studied by chemical analysis of tissue samples removed from living tissue or organism. In the process, the tissue examined loses viability in its original form and function.

Developments in radiography during this century have led to analysis of metabolic activity based on the external application of ionizing radiation. In this approach, living tissue exhibits characteristic attenuation of the energy applied. Attenuation differences between adjacent tissues can be reflected by different exposure intensities of film. Alternative approaches include internal application of ionizing radiation, typically by injection of radioisotopes into the circulation, with image production resulting from anatomic distribution and concentration of radioactivity. Both approaches have been prevalent in medicine since early this century.

In the mid-1940's, the physical phenomenon of nuclear magnetism was discovered. Initially, the phenomenon was used to study chemical constructs in relatively pure forms, with the most actively studied isotope being 'H (Proton). Toward the 1960's, the lessons of nuclear magnetic spectroscopy were increasingly applied to complex chemical compositions, such as living biological macromolecules, and ultimately living biological tissues, such as cell water. The field expanded to include medically relevant applications when, in 1971, R. Damadian reported in Science (171:1151-53, 1971) his ability to detect tumors by measurement of different proton resonance in cell water derived from tumors.

During the years since 1971, study of living biological magnetic resonance has been used to create both numerical representation of isotopes (Magnetic Resonance Spectroscopy; MRS) as well as graphic images of their location and metabolic characteristics within living tissue. The latter technology has been adapted by the world of medicine and applied in a manner known as Magnetic Resonance Imaging (MRI). MRI has been found to offer advantages over other diagnostic modalities in selected cases, such as the diagnosis of pheochromocytoma and diseases of the central nervous system. MRI is generally considered harmless at current configurations because of the low intensity magnetic radiation utilized to cause the nuclei to emit a resonance signal. Despite this attribute, it has yet to supplant Computerized Axial Tomography (CAT) scanning, which gives generally similar anatomical images, but whose application is limited by the risks of ionizing radiation and the frequent need for adjunctive toxic contrast media. The reasons undoubtedly include cost, but also the absence of multiple clearly demonstrable advantages over other existing techniques, such as CAT scanning. Improvements in the diagnostic capabilities of MRI would be welcome in the study of biology in general, but especially in the world of medicine, where concern for human health limits the use of other diagnostic methods such as cat scanning which may have an unacceptably high risk/benefit ratio for the particular diagnostic procedure.

The types of atoms having naturally occurring magnetic isotopes is large but is not unlimited. Further, the relative proportion of any specific magnetic isotope of a given atom is frequently very low (Ex., C. S. Springer, Jr. "Measurement of Metal Cation Compartmentalization In Tissue By High-Resolution Metal Cation NMR", Ann Rev Biophys Chem 16:375-99, 1987). Thus, the application of medical MRI has focused on the most abundant magnetic nucleus in living biological tissues, $^1H$, because of its prevalence in nature and because of the relative scarcity of other magnetic isotopes Ex., R. L. Nunnally and PR Antich, "New Directions in Medical Imaging of Cancer" (Cancer 67:1271-1277, 1991). Attempts have also been made to utilize other naturally occurring magnetic nuclei, such as $^{13}C$, $^{19}F$, $^{23}Na$, and $^{31}P$. As for example disclosed in U.S. Pat. No. 4,779,619 where $^{23}Na$ is used for brain function analysis. Also, for example, H. Kantor et al, "In Vivo $^{31}P$ Nuclear Magnetic Resonance Measurements in Canine Heart Using a Catheter-Coil" (Circ Res 55:261-266, 1984), disclose the use of $^{31}P$ for heart function analysis in canines; and I. R. Francis et al, "Malignant Hepatic Tumors: P-31 MR Spectroscopy with One-dimensional Chemical Shift Imaging" (Radiology 180:341-344 1991), disclose use of naturally occurring $^{31}P$ for liver tumor detection.

In an effort to improve resonance detection, technical innovations have been applied to MRI machinery. Many imaging modalities have been introduced since Lauterbur introduced the concept of "zeugmatography". Hardware configuration has evolved to include a variety of magnets to alternatively establish and remove magnetic fields so nuclear magnetic resonance is generated. Advances in antenna design for detecting the resonance frequencies of various nuclei include surface applied or internally applied coils, with easily interchangeable frequency sensitivities. For example, U.S. Pat. No. 4,672,972 discloses a solid state NMR probe which both receives a resonance on or from proximate tissue and modulates a magnetic field in the proximity of the tissue from which resonance signal is detected.

Attempts have also been made to alter the physical environment within the tissue. One method causes induction of normal metabolic cascades known to alter the spin states of the magnetic nucleus. Thus, for example, fructose causes reduction of MRI-detectable inorganic liver phosphate, and allows a dynamic assessment of liver function through $^{37}P$ spectroscopy (F. Terrier et al, Radiology 171:557-563 1989).

Other approaches, as disclosed in U.S. Pat. Nos. 4,532,217; 4,731,239; 4,735,796; 4,849,210; and 4,985,233 include the use or administration of paramagnetic, diamagnetic, and ferromagnetic contrast enhancement particles or agents, which agents may or may not be metabolized by the tissue; but, which agents normally have little if anything to do with the metabolic activity of the tissue in question. Essentially a contrast between areas in which signals are generated by the isotope and those where they are not generated is enhanced to create a greater "shadow" for imaging purposes. Such contrast agents, for example, may cause reduction of relaxation times of an endogenous (i.e. unadministered) nucleus under study and improve signal/noise ratios. Alternatively, as for example with metabolizable ferromagnetic particles such as iron dextran particles, the contrast agents may focus and concentrate the magnetic field. Contrast agents, such a those described in the patents listed above, specifically do not contain MRI-sensitive nuclei. By definition, such contrast enhancers are not detected directly on images and spectra; they are not generating the resonance frequency signal, but rather they act to alter the magnetic environment of an endogenous isotope under analysis.

To a limited extent, chemists have previously applied increased concentrations of various magnetic isotopes to proteins and enzymes and other non-living macromolecules for NMR studies. Pharmacologist have even used naturally abundant, i.e. unenriched, magnetic isotopes to label drugs for the study of drug metabolism and distribution, in living organisms. There are recommendations in the literature, however, to avoid the use of most magnetic isotopes as their concentrations are low enough as to render them useless under current configurations and applications (Ex., Crooks et al., "Tomography of hydrogen with nuclear magnetic resonance (NMR) and the potential for imaging other body constituents" SPIE 206:120-128, 1979). In part because of the emphasis on NMR studies of naturally abundant magnetic isotopes and in part because of such recommendations most magnetic isotopes have been ignored; exogenous administration of concentrated magnetic isotopes for the study of living biological tissue has not been discovered.

Prostatic cancer has been studied with $^1H$ MRI. The resolution of the MRI images has been limited and improved contrast agent methodologies as well as improved probes have been developed to address this limitation. Prostatic zinc metabolism has separately been studied using various radioactive Zn isotopes, such as $^{65}Zn$ and $^{69}Zn$, administered to test subjects. The rapid uptake of Zn by the prostate and discrepancies between Zn metabolism and distribution in healthy and diseased prostates have been observed. These observations have not previously led to the concept of $^{67}Zn$ prostatic MRI. The low natural concentration of $^{67}Zn$ would result in poor resolution. Prior to the present invention, despite the need for better testing modalities, increasing the concentration of non-radioactive magnetic $^{67}Zn$ was not disclosed, suggested or implemented.

SUMMARY OF THE INVENTION

The invention comprises a method for detection, spectra analysis and imaging the concentration and characteristics of magnetic nuclei in living biological tissue. Magnetic isotopes are administered to living biological tissue in a chemical form in which it is bioavailable and at concentration levels greater than naturally occurring concentration levels, i.e. at which the magnetic isotope has been enriched. The magnetic isotope administered is selected from isotopes of elements which are metabolized by the living biological tissue. The tissue is allowed to absorb and metabolize the isotope. The tissue is then, for example, subjected to a magnetic field which will orient all nuclei with nonzero spin and generate a net magnetic moment M, aligned parallel to the field, within the tissue. When the excitation magnetic pulse is interrupted, the nuclei return to their original equilibrium with characteristic resonance. In the process the nuclei emit radiation in the radio frequency region of the electromagnetic spectrum. This radiation is detected and converted into spectra or images which reflect the concentration and chemical characteristics of the nuclei. These spectra or images are then used to study the normal physiology of the isotope and following this to detect abnormal biology.

The invention provides a new method for studying normal biology and detecting aberrations in that biology. It relies on some of the existing MRS and MRI technology, but differs significantly in its method of signal enhancement. In previously described signal enhancement, "contrast" agents are not directly measurable and are not the source of signal. In contradistinction, this invention describes the augmentation of signal by increasing the concentration of physiologically relevant magnetic nuclei by exogenous administration. The administered nuclei are thus very directly and advantageously the source of signal.

This inventive concept and method where the magnetic resonant signal itself is increased has many advantages over prior methodology both with and without the use of signal enhancement though the application of contrast agent particles. The previous focus on ferromagnetic, paramagnetic and diamagnetic enhancers is further evidence of the novelty of the methodology of directly increasing the quantity of resonance signal through the application of increased concentrations of magnetic isotopes to study absorption or metabolization in living biological tissue. Such a technique has long been needed.

DETAILED DESCRIPTION OF THE INVENTION

For the purpose of this disclosure the term "living biological tissue" refers to subcellular, monocellular and multicellular reproducing organisms including but not limited to vertebrates, invertebrates, plants, bacteria, viruses and yeast. This further includes fluids, cells, or organs as specimens, biopsies, or independent cultures of such organisms.

Advantageously relevant magnetic isotopes can be identified for a multitude of specific applications of the method according to the present invention. Many magnetic and nonmagnetic nuclei are described by the scientific community, and in particular in chemistry and physics literature. Compilations of spin characteristics, magnetic and quadrupole moments, as well as magnetic resonance frequencies are published.

Distribution of various atoms in certain living biological tissues are described in the chemistry, biology, and medicine literature. Some such descriptions include the distribution of common atoms, for example the ubiquitous H, and of more rare atoms, for example Se. From descriptions of distributions of various atoms and the magnetic characteristics of such atoms, those which are relevant or useful, to a given study of a particular living biological tissue can be selected. Once an atom be identified by a literature search. Scientific experimentation may further lead to identification of magnetic isotopes which are not identifiable through a literature search.

Many relevant or useful magnetic isotopes predominate in nature, and some, for example $^1H$, are readily available for study as natural components in living biological tissue. The signal of magnetic isotopes naturally occurring in 100% concentrations will not be benefitted directly by the present method. However, such atoms are not always relevant or useful for a particular living biological tissue or a specific metabolization, abnormality, analysis, or study with such living biological tissue. The signal from any isotope naturally occurring in less than 100% concentration (Ex., $^{14}$N [99.6%], $^{39}$K [93.1%], $^{35}$Cl [75.5%]) will be enhanced by increasing the concentration according to the present method. Magnetic isotopes which may be particularly relevant for a given living biological tissue investigation represent minor components of naturally occurring atoms (Ex., $^{113}$Cd [12%], $^{67}$Zn [4%], $^{13}$C [1%], $^{17}$O [0.04%], $^{25}$Mg [10%], $^{33}$S [0.08%], $^{43}$Ca [0.2%]), and could be greatly enriched by exogenous administration. Many such potentially relevant isotopes can be readily purchased from government and commercial sources.

One of the aspects of the present inventive method is the administration of relevant magnetic isotopes to living biological tissue. For the purpose of this invention, "administration" means exposing the living biological tissue under study to the relevant isotope such that the living biological tissue will absorb and process the relevant isotope to meet its own living biological directives. Relevant isotopes may have to be chemically processed so as to render them more accessible to the living biological tissue under study, and so as to minimize untoward effects of the co-constituents in the chemical formulation. For example $^{67}$Zn is available as zinc oxide from the US Department of Energy, but may be easily converted into the more soluble zinc chloride salt.

Administration may be done by a variety of means, depending on the living biological tissue and its milieu. In the case of cell or organ culture, administration could consist of bathing the cells or organ in medium containing solutions of relevant isotope, $^{113}$CdCl$_2$ for example. In the case of whole organisms, it could consist of exposing the organism to the relevant isotope by a variety of methods including but not limited to: 1) transdermal (skin and mucous membranes [example, nasal mucosa]) or enteric contact (oral, ano-rectal, or nasogastric); 2) intradermal, subcutaneous, intramuscular, intravenous, intra-arterial, intrathecal, intravisceral, or intraperitoneal injection; or 3) transurethral and/or intravesical contact.

Tissue will be prepared for NMR analysis according to the specifications of the analytical tools. In the case of cells, organs, biopsy specimens, or body fluids they may be purified from living biological tissue and assayed directly or in solution. In the case of whole organisms, including man, the relevant isotope would be studied within the host organism, in a manner similar to that currently use in medicine. For example, external or internal antenna or probes can be passed in proximity to the area of interest. A magnetic field can be applied and released. The frequency, phase angle, duration times and interrupt times can be adjusted for the study based on considerations such as the isotope which generates the signal, tissue structure, enhancing agents, if any also used and other normally or newly considered factors of the study to be conducted. The magnetic resonance can be spectrographically detected, mapped, graphed imaged or otherwise studied by techniques now known or later developed.

Examples of the general application of this method include the study of cancer or other diseases in animals including humans.

Examples of the specific application of the present method include the study of prostate or the pancreas using $^{67}$Zn which has a low natural abundance of about 4%. However Zn plays an important role for the function of each of these glands. Cancerous conditions as well as other abnormalities may be detected, or more accurately staged at early stages of the cancer or other disease.

EXAMPLE 1

$^{67}$Zn IN THE CLINICAL ANALYSIS OF HUMAN PROSTATE CANCER

Zinc is an integral component of the human diet. It is widely distributed in the body following intestinal absorption, and is known to be essential for the function of a vast array of physiological functions. Despite its wide distribution, zinc concentrations vary dramatically from organ to organ, with particularly high concentrations in the prostate.

Prostatic zinc has been extensively studied in both humans and animals. It appears to be both an integral element in intracellular metabolism and an integral element in prostatic secretions contributing to ejaculate. Regardless of its normal role in physiology and reproduction, prostatic zinc concentration varies as a function of disease: prostatitis, benign prostatic hyperplasia, and prostate cancer. Previous studies have indicated this with great consistency, and one group of investigators even suggested the role of altered zinc levels as an indicator of imminent malignant transformation. Studies on prostatic zinc indicate that not only is zinc concentration altered in disease, but that cellular disposition of zinc, including its molecular associates, are altered. These factors will alter the magnetic resonance of the prostatic zinc nucleus.

Prostate cancer remains one of the leading causes of cancer death in the United States. Many issues in its diagnosis and management remain unresolved. One of these issues is the problem of staging. For example, a patient may have cancer diagnosed incidently following surgery for benign hyperplasia. Further treatment options for this so-called stage A tumor are then dictated by an analysis of residual tumor, and may range from observation to radical surgery. Unfortunately, current staging procedures are highly inaccurate in this setting, given the fact that no tumor was diagnosed prior to the first operation. An accurate staging method would potentially obviate the need for further surgery in some patients, confirm the need in others, or suggest metastatic disease and the need for systemic therapy in others. Such a method would potentially be useful in screening and directing biopsies.

Traditional $^1$H MRI has been used in imaging the prostate, but while offering perhaps greater resolution than CAT scanning, is of no real use in the problem described. This is altered by the present invention.

Zinc metabolism has been extensively studied in the human, in particular in regards to its bioavailability. Stable isotopes, $^{67}$Zn and $^{70}$Zn, as well as radioactive $^{65}$Zn have been used. These isotopes have been given orally as well as intravenously, and the kinetics of their distribution and elimination are well worked out. It is known from radioactivity scanning that zinc is rapidly absorbed by the prostate, for example.

In accordance with the present invention, nonradioactive magnetic isotope $^{67}$Zn in increased concentrations (i.e. greater than the 4% abundance level of $^{67}$Zn which naturally occurs) is administered to a patient with recently diagnosed prostate cancer. Before, during and/or following administration, the patient would undergo MRI utilizing probes configured to measure $^{67}$Zn resonance. These probes are preferably mounted within endorectal catheters for maximization of resolution, as has been described in the case of $^{1}$H prostatic MRI. Following conversion to anatomical images, determinations of focal altered zinc concentrations are made, with confirmation of pathology by aspiration cytology or biopsy as indicated.

EXAMPLE 2

$^{67}$Zn In the clinical Analysis of Human Pancreas Tumores

Zinc is an integral component of the human diet. It is widely distributed in the body following intestinal absorption, and is known to be essential for the function of a vast array of physiological functions. Despite its wide distribution, zinc concentrations vary dramatically from organ to organ, with particularly high concentrations in the pancreas.

Pancreatic zinc has been studied in both humans and animals. It appears to be both an integral element in intracellular metabolism and an integral element in secretions. Pancreatic cancer remains a difficult therapeutic challenge. Many issues in its diagnosis and management remain unresolved.

Zinc metabolism has been extensively studied in the human, particular in regards to its bioavailability. Several zinc isotopes have been used for this research, primarily the radioactive $^{65}$Zn. These isotopes have been given orally as well as intravenously, and the kinetics of their distribution and elimination are well worked out. It is known from radioactivity scanning that zinc is rapidly absorbed by the pancreas, for example.

In accordance with the present invention, nonradioactive magnetic isotope $^{67}$Zn in increased concentrations (i.e. greater than the 4% abundance level of $^{67}$Zn which naturally occurs) is administered to a patient with a suspected tumor. Before, during and/or following administration, the patient undergoes MRI utilizing probes configured to measure $^{67}$Zn resonance. These probes are mounted for maximization of resolution. Following conversion to anatomical images, determinations of focal altered zinc concentrations are made, with confirmation of pathology by aspiration cytology or biopsy as indicated.

Other alterations and modifications of the invention will likewise become apparent to those of ordinary skill in the art upon reading the present disclosure, and it is intended that the scope of the invention disclosed herein be limited only by the broadest interpretation of the appended claims to which the inventor is legally entitled.

I claim:

1. A method of enhancing a magnetic resonance signal in a living biological tissue comprising the steps of:
    (a) selecting $^{67}$Zn as a magnetic isotope of an element which is of interest in diagnosis of disease in a living biological tissue;
    (b) administering to said living biological tissue a quantity of said $^{67}$Zn in a form in which said $^{67}$Zn is absorbable by said living biological tissue, which administered quantity of $^{67}$Zn has a concentration greater than the concentration of $^{67}$Zn naturally occurring outside of said living biological tissue; and
    (c) detecting magnetic resonance signal which is emitted from said administered $^{67}$Zn in the living biological tissue.

2. A method of enhancing a magnetic resonance signal as in claim 1 further comprising the step of allowing at least a portion of the quantity of administered isotope of $^{67}$Zn to be absorbed by the living biological tissue before detecting the magnetic resonance signal.

3. The method of claim 1 wherein said step of administering said $^{67}$Zn in an absorbable form comprises the steps of:
    (a) producing a salt solution with a concentration of said $^{67}$Zn which is greater than the naturally occurring concentration of said selected magnetic isotope; and
    (b) exposing the living biological tissue under study to said salt solution of said $^{67}$Zn so that said biological tissue will absorb and process said $^{67}$Zn to meet its own living biological directives.

4. The method of claim 2 wherein the living biological tissue to be analyzed is from the human prostate.

5. The method of claim 1 wherein the step of detecting the magnetic resonance signal comprises the steps: of
    (a) subjecting the $^{67}$Zn in the living biological tissue to a magnetic field;
    (b) removing the magnetic field;
    (c) detecting the characteristic resonance radiation of the administered $^{67}$Zn as the magnetic field is removed; and
    (d) analyzing the detected resonant radiation from the administered $^{67}$Zn with spectra, images, or other forms of data representation.

6. A method for magnetic resonance imaging (MRI) of a living biological tissue comprising prior to the MERI of a living biological tissue administering $^{67}$Zn in a soluble salt compound from which $^{67}$Zn can be absorbed by the biological tissue and which administered $^{67}$Zn is present in the salt compound at a higher than normal concentration so that an enhanced signal for the MRI image is generated by the $^{67}$Zn.

7. A method as in claim 6 further comprising the step of administering the $^{67}$Zn to humans.

8. A method of disease detection in humans comprising the steps of:
    (a) administering to a living biological human tissue, a quantity of Zn having a concentration of $^{67}$Zn greater than the abundance of naturally occurring Zn outside of the human body;
    (b) allowing the $^{67}$Zn to be absorbed, assimilated or metabolized;
    (c) subjecting the living biological human tissue to NMR detection; and
    (d) comparing the NMR detection of the living biological human tissue to standards by which disease can be detected.

9. The method of claim 8 wherein the disease is prostatic cancer and the tissue subjected to NMR is prostate issue.

10. The method of claim 8 wherein the disease is benign prostatic hyperplasia and the tissue is prostate tissue.

11. The method of claim 9 wherein the disease is prostatic infection.

12. The method of claim 8 wherein the disease is malignant tumors (cancer) of the pancreas and the tissue subjected to NMR is pancreatic tissue.

13. The method of claim 8 wherein the disease is benign tumors of the pancreas and the tissue is pancreatic.

14. The method of claim 8 wherein the disease is diabetes and the tissue subjected to NMR is pancreatic tissue.

15. The method of claim 8 wherein the disease is carcinoid and the tissue is carcinoid tissue.

* * * * *

UNITED STATES PATENT AND TRADEMARK OFFICE
CERTIFICATE OF CORRECTION

PATENT NO. : 5,250,284
DATED : October 5, 1993
INVENTOR(S) : Arnon Krongrad

It is certified that error appears in the above-indentified patent and that said Letters Patent is hereby corrected as shown below:

Column 1, line 42, replace "'H" with $--^{1}H--$.
Column 4, line 62, a line was left out. Replace "Once an atom be identified by a listerature search." with --Once an atom of interest has been selected, its magnetic isotopes can be identified by a literature search."
Column 7, line 15, replace "Tumores" with --Tumors--.
Column 8, claim 5, line 25, and 26, delete ":" following "steps" and insert --:-- following "of".
Column 8, claim 6, line 39, replace "MERI" with --MRI--.

Signed and Sealed this

Twenty-sixth Day of April, 1994

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,250,284
DATED : October 5, 1993
INVENTOR(S) : Arnon Krongrad

It is certified that error appears in the above-indentified patent and that said Letters Patent is hereby corrected as shown below:

Column 3, line 10, replace "such a" with --such as--.

Column 3, line 20, replace "Pharmacologist" with --Pharmacologists--.

Column 5, line 54, insert --in-- following "currently"; line 64, insert --,-- following "graphed".

Signed and Sealed this

Ninth Day of August, 1994

Attest:

BRUCE LEHMAN

Attesting Officer

Commissioner of Patents and Trademarks